United States Patent
Cheng et al.

(10) Patent No.: US 9,653,683 B2
(45) Date of Patent: *May 16, 2017

(54) PHASE CHANGE MEMORY CELL WITH IMPROVED PHASE CHANGE MATERIAL

(71) Applicants: INTERNATIONAL BUSINESS MACHINES CORPORATION, Armonk, NY (US); Macronix International Company, Ltd., Hsinchu (TW)

(72) Inventors: Huai-Yu Cheng, White Plains, NY (US); Simone Raoux, New York, NY (US)

(73) Assignees: INTERNATIONAL BUSINESS MACHINES CORPORATION, Armonk, NY (US); MACRONIX INTERNATIONAL COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/983,986

(22) Filed: Dec. 30, 2015

(65) Prior Publication Data

US 2016/0118582 A1 Apr. 28, 2016

Related U.S. Application Data

(63) Continuation of application No. 13/968,529, filed on Aug. 16, 2013, now Pat. No. 9,257,643.

(51) Int. Cl.
H01L 45/00 (2006.01)

(52) U.S. Cl.
CPC .......... *H01L 45/148* (2013.01); *H01L 45/06* (2013.01); *H01L 45/1233* (2013.01); *H01L 45/143* (2013.01); *H01L 45/144* (2013.01); *H01L 45/1608* (2013.01)

(58) Field of Classification Search
CPC ..... H01L 45/14; H01L 45/141; H01L 45/142; H01L 45/143; H01L 45/148; H01L 45/00–45/1691
See application file for complete search history.

(56) References Cited

U.S. PATENT DOCUMENTS

2009/0194759 A1* 8/2009 Chin ............... H01L 45/06 257/4
2012/0181499 A1* 7/2012 Chuang ........... H01L 45/06 257/2

OTHER PUBLICATIONS

Chang et al., "Ga19Sb81 film for multi-level phase-change memory" Thin Solid Films (2013). (4 pages).
Chang et al "Crystallization Kinetics of Amorphous Ga-Sb films Extended for Phase-change Memory" IEEE 2010, Jul. 2010. (2 pages).

(Continued)

*Primary Examiner* — Eric Ward
(74) *Attorney, Agent, or Firm* — Tutunjian & Bitetto, P.C.; Vazken Alexanian

(57) ABSTRACT

A phase change memory cell. The phase change memory cell includes a substrate and a phase change material. The phase change material is deposited on the substrate for performing a phase change function in the phase change memory cell. The phase change material is an alloy having a mass density change of less than three percent during a transition between an amorphous phase and a crystalline phase.

11 Claims, 6 Drawing Sheets

(56) References Cited

OTHER PUBLICATIONS

Cheng et al., "The Crystallization Behavior of Ga-Sb Materials as a Function of Composition for Phase Change Random Access Memory" Appl. Phys. Lett. 98, 121911, Mar. 2011. (7 pages).
Kao et al., "Ga2Te3Sb5—A Candidate for Fast and Ultralong Retention Phase-Change Memory" Adv. Mater. Jun. 2009, 21, pp. 1-5.
Krebs et al., "GaSb for Phase Change Memory Devices" 2012 MRS Spring Meeting, Apr. 2012. (2 pages).
Raoux et al., "Phase transitions in Ga-Sb phase change alloys" Phys. Status Solidi B 249, No. 10, 1994-2004 (2012), Sep. 2012. (7 pages).

* cited by examiner

PHASE CHANGE MEMORY CELL WITH IMPROVED PHASE CHANGE MATERIAL

BACKGROUND

Technical Field

The present invention relates generally to memory cells and, in particular, to a phase change memory cell with improved phase change material.

Description of the Related Art

One main failure mechanism for phase change memory (PCRAM) devices is void formation after repeated cycling. If the void is formed on top of the bottom electrode, the PCRAM device is stuck in the open (high resistance) position and cannot be switched anymore to the low resistance state. This effect is most likely due to the large change in mass density between the amorphous and crystalline phase of the phase change material (typically 5-6%).

SUMMARY

According to an aspect of the present principles, a phase change memory cell is provided. The phase change memory cell includes a substrate and a phase change material. The phase change material is deposited on the substrate for performing a phase change function in the phase change memory cell. The phase change material is an alloy having a mass density change of less than three percent during a transition between an amorphous phase and a crystalline phase.

According to another aspect of the present principles, a method is provided for forming a phase change memory cell. The method includes providing a substrate. The method further includes depositing a phase change material on the substrate for performing a phase change function in the phase change memory cell. The phase change material is an alloy having a mass density change of less than three percent during a transition between an amorphous phase and a crystalline phase.

According to yet another aspect of the present principles, a method is provided for forming a phase change memory cell. The method includes providing a substrate for the phase change material. The method further includes depositing a mixture of Gallium (Ga), Antimony (Sb) and at least one of Tellurium (Te), Silicon (Si), Germanium (Ge), Arsenic (As), Selenium (Se), Indium (In), Tin (Sn), Bismuth (Bi), Silver (Ag), and Gold (Au) on the substrate as a phase change material for a phase change portion of the phase change memory cell. The phase change material has a mass density change of less than 3 percent during a transition between an amorphous phase and a crystalline phase.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a phase change memory cell with improved phase change material.

As noted above, one main failure mechanism for PCRAM devices is void formation after repeated cycling. We solve this problem by designing a phase change material that has much reduced or no mass density change upon crystallization but still has large electrical contrast and fast switching properties.

As used here, the convention "Ga:Sb=X:Y" refers to a mixture of Gallium (Ga) and Antimony (Sb) having X atomic % parts of Gallium to Y atomic % parts of Antimony. Of course, the convention can also apply to other elements described herein, while maintaining the spirit of the present principles.

Figure 1:
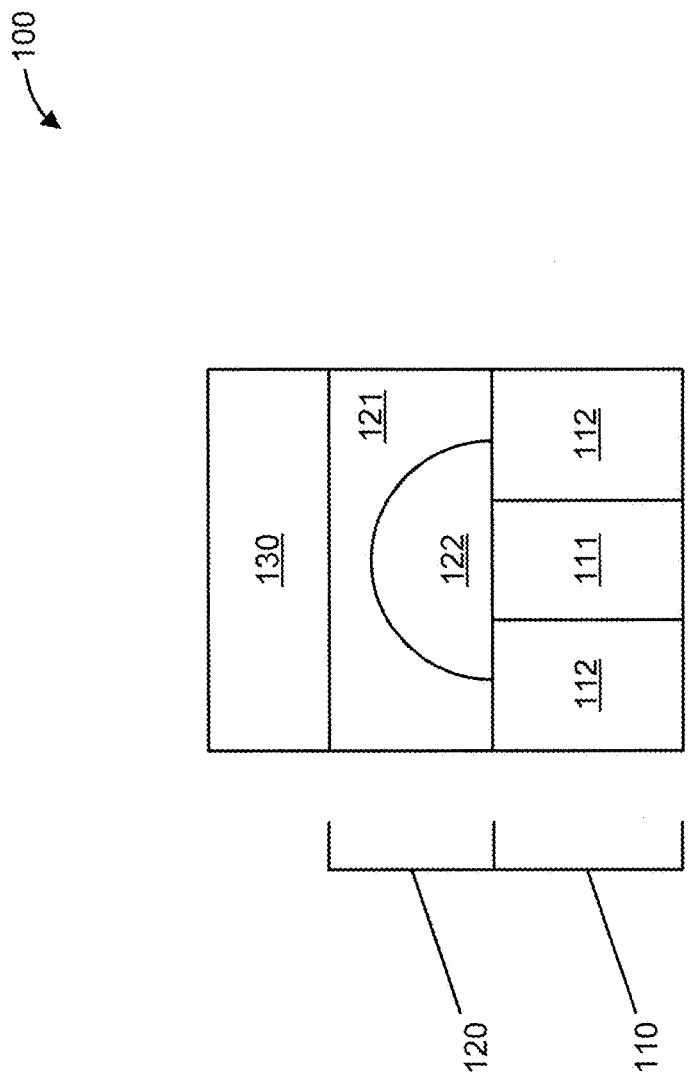
FIG. 1 shows a portion 100 of a phase change memory cell, in accordance with an embodiment of the present principles.

FIG. 1 shows a portion 100 of a phase change memory cell, in accordance with an embodiment of the present principles. The portion 100 includes a substrate 110 having a bottom electrode contact 111 surrounded by an insulator 112. On top of this substrate 110, a phase change alloy 120 is located with a fraction of phase change material that will not switch 121 and with a dome-shaped programmable region 122 above the bottom electrode contact 111 which will change phase during operation. On top of that phase change alloy 120, a top electrode contact 130 is formed. The phase change alloy 120 is deposited on the substrate 110 that includes the bottom electrode contact 111 and the surrounding insulator 112. This is the exemplary layout of a so-called mushroom cell. However, it is to be appreciated that the present principles are readily applied to other PCRAM cell designs, while maintaining the spirit of the present principles.

The portion 100 of the memory cell 110 can be formed on, but is not limited to, a Silicon (Si) wafer. In an embodiment, this Si wafer has been lithographically processed for the fabrication of a memory cell up to the step for the deposition of the actual phase change memory material. In particular, at least in most memory cell designs, the memory cell includes the bottom electrode contact of the memory cell. The memory cell includes the phase change material contacted by two electrodes. In many cases a bottom electrode and a top electrode are used, but sometimes contact is also made from the side. These and other variations of a memory cell are readily contemplated by one of ordinary skill in the art, and are readily utilized in accordance with the teachings of the present principles.

The alloy 120 is formed from a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb). It is to be appreciated that the preceding list is merely illustrative and, thus, other elements can also be used to form the alloy 120, while maintaining the spirit of the present principles.

In an embodiment, the starting material for the alloy 120 is GaSb 1:1. Additionally, at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb) is added to the starting material to obtain the resultant alloy 120.

Figure 2:
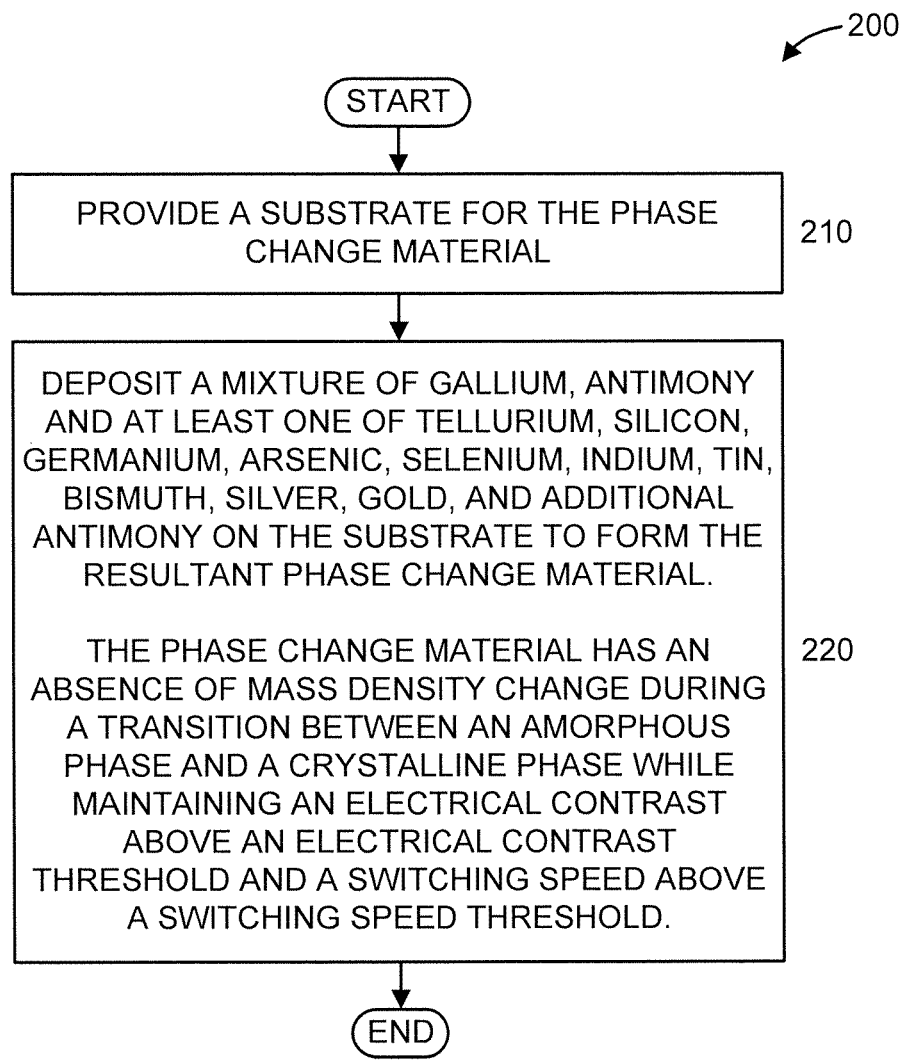
FIG. 2 shows a method 200 for forming a phase change material for a phase change memory cell, in accordance with an embodiment of the present principles.

FIG. 2 shows a method 200 for forming a phase change material for a phase change memory cell, in accordance with an embodiment of the present principles.

At step 210, provide a substrate for the phrase change material.

At step 220, deposit a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb) on the substrate to form the resultant phase change material. The resultant phase change material has an absence of mass density change during a transition between an amorphous phase and a crystalline phase while maintaining an electrical contrast above an electrical contrast threshold and a switching time below a switching time threshold.

It is to be appreciated that the mixture can be deposited as a thin film on the substrate using any deposition techniques including any chemical and/or physical deposition techniques.

As used herein, reference to the phase change material having an absence of mass density change during a transition between an amorphous phase and a crystalline phase refers to a mass density change of less than 3%.

As used here, the term "electrical contrast" refers to the difference between the electrical resistance of the PCRAM device in the low resistance (crystalline) state and the high resistance (partially or fully amorphous) state. As merely examples provided for illustrative purposes, the electrical contrast threshold can be, but is not limited to, for example a factor between 10 and 100, and the switching time threshold can be, but is not limited to, for example, in the nanosecond to microsecond time range.

As will be appreciated by one skilled in the art, aspects of the present invention may be embodied as a system, method or computer program product. Accordingly, aspects of the present invention may take the form of an entirely hardware embodiment, or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In an embodiment, the starting material is stoichiometric Gallium-Antimony (GaSb). This is a phase change material which has unusual properties as it shows a reduction in mass density upon transformation from the amorphous to the crystalline phase and an inverse optical contrast (the amorphous phase is more reflective than the crystalline phase) for example, at a wavelength of 633 nm, compared to the vast majority of phase change materials which show an increase of mass density upon crystallization and positive optical contrast (the amorphous phase has a lower reflectivity than the crystalline phase). We engineer a phase change material with much reduced or no mass density change by adding to GaSb another element or several other elements in such a composition that the resulting phase change alloy has very little or no mass density change but still high electrical contrast and fast switching properties.

Figure 3:
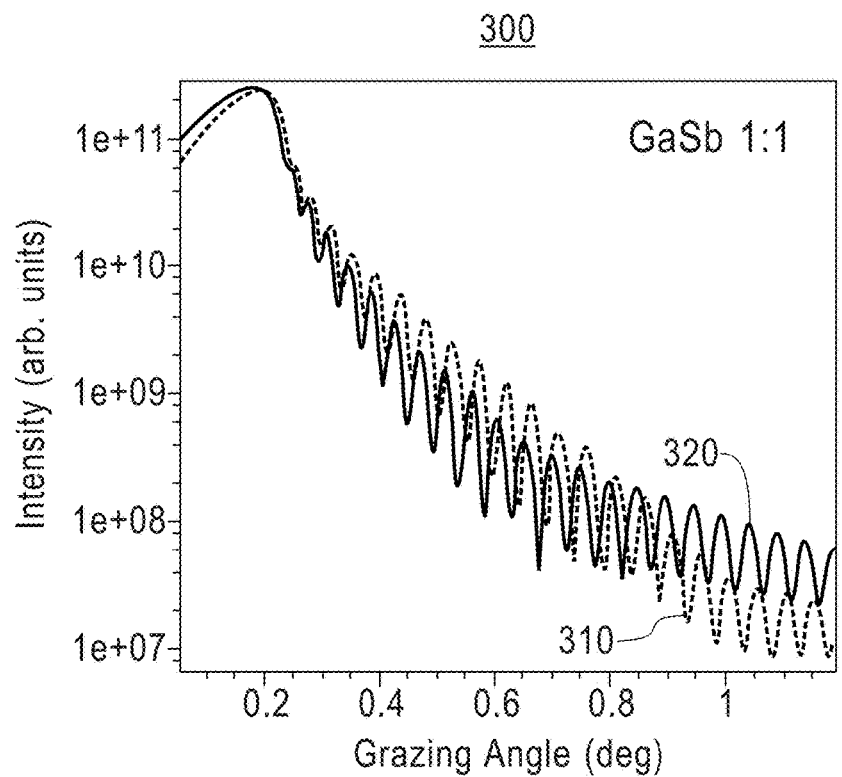
FIG. 3 shows a plot 300 of x-ray reflectivity (XRR) measurements performed on a Ga:Sb=1:1 film of 50 nm thickness as deposited (amorphous) and after heating to 350° C., in accordance with an embodiment of the present principles.

We found that GaSb shows a reduction in mass density upon crystallization. FIG. 3 shows a plot 300 of x-ray reflectivity (XRR) measurements performed on a Ga:Sb=1:1 film of 50 nm thickness as deposited (amorphous) (shown using line 310) and after heating to 350° C. (crystalline) (shown using line 320), in accordance with an embodiment of the present principles. In the plot 300, the x-axis represents grazing incidence angle in degrees and the y-axis represents intensity of reflected x-rays in relative units. The positions of the peaks are shifted to lower angles for the crystalline film compared to the amorphous film, which is an indication of an increase in the film thickness, i.e., a decrease in the mass density.

Figure 4:
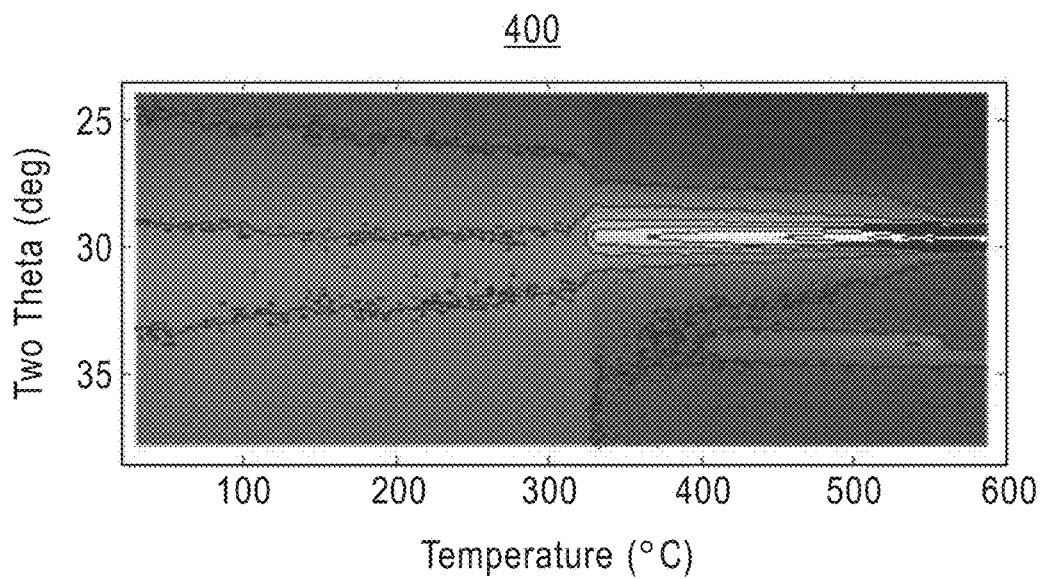
FIG. 4 shows a plot 400 of intensity of diffracted x-rays as a function of temperature during heating at 1 degree Celsius per second on the Ga:Sb=1:1 film of 50 nm thickness shown in FIG. 3, in accordance with an embodiment of the present principles.

FIG. 4 shows a plot 400 of intensity of diffracted x-rays as a function of temperature during heating at 1 degree Celsius per second on the Ga:Sb=1:1 film of 50 nm thickness shown in FIG. 3, in accordance with an embodiment of the present principles. In the plot 400, the x-axis represents temperature (in degrees Celsius) and the y-axis represents two-theta angle (in degrees). The time resolved x-ray diffraction (XRD) shows that the crystallization temperature of this film is 327° C. That is, for the XRD scan of the material (i.e., Ga:Sb=1:1 film of 50 nm thickness) heated at a rate of 1° C./s, the appearance of the XRD peaks at 327° C. indicates crystallization of the material.

Figure 5:
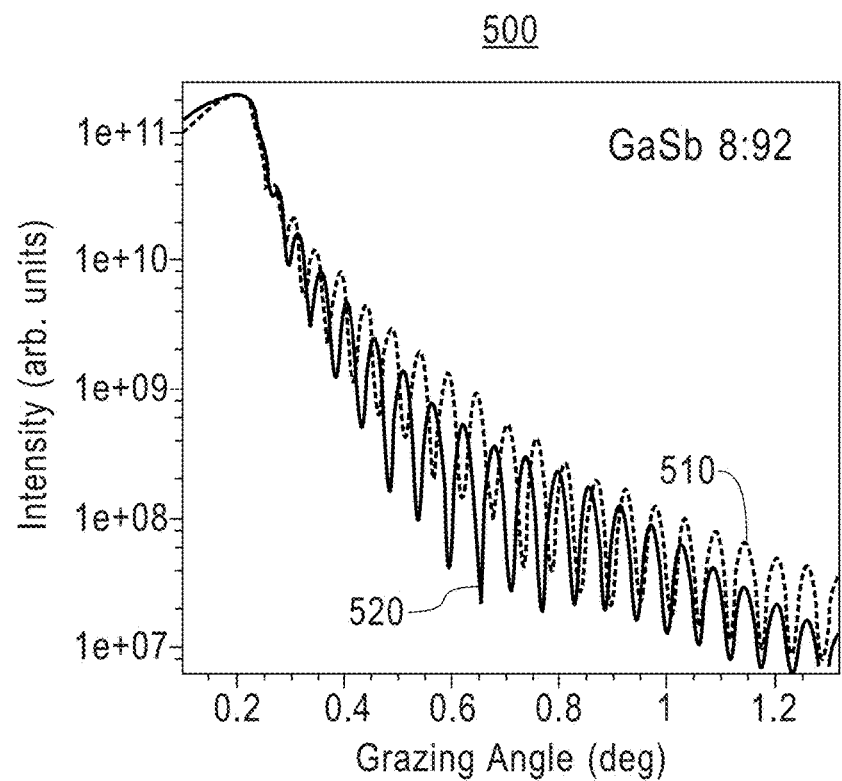
FIG. 5 shows a plot 500 of x-ray reflectivity (XRR) measurements performed on a Ga:Sb=8:92 film of 48 nm thickness as deposited (amorphous) and after heating to 350° C., in accordance with an embodiment of the present principles.

FIG. 5 shows a plot 500 of x-ray reflectivity (XRR) measurements performed on a Ga:Sb=8:92 film of 48 nm thickness as deposited (amorphous) (shown using line 510) and after heating to 350° C. (crystalline) (shown using line 520), in accordance with an embodiment of the present principles. In the plot 500, the x-axis represents grazing incidence angle in degrees and the y-axis represents intensity of reflected x-rays in relative units. Thus, when large amounts of Sb are added to GaSb to form a thin film of the composition Ga:Sb=8:92, the XRR measurements show a shift of peak positions of the crystalline film compared to the amorphous film to higher angles indicative of a thinner film and thus a mass density increase. The number of atoms per area was measured for both films using Rutherford Backscattering Spectrometry to verify that the reduced film thickness was not due to material loss during heating.

Figure 6:
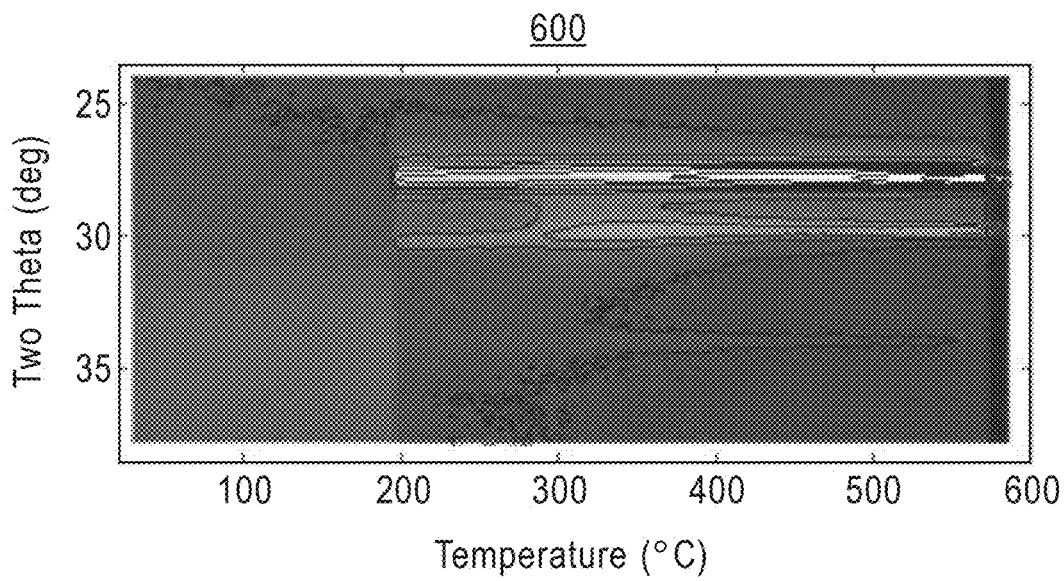
FIG. 6 shows a plot 600 of intensity of diffracted x-rays as a function of temperature during heating at 1 degree Celsius per second on the Ga:Sb=8:92 film of 48 nm thickness shown in FIG. 5, in accordance with an embodiment of the present principles.

FIG. 6 shows a plot 600 of intensity of diffracted x-rays as a function of temperature during heating at 1 degree Celsius per second on the Ga:Sb=8:92 film of 48 nm thickness shown in FIG. 5, in accordance with an embodiment of the present principles. In the plot 600, the x-axis represents temperature (in degrees Celsius) and the y-axis represents two-theta angle (in degrees). The time resolved XRD shows that the crystallization temperature of this film is 195° C. That is, for the XRD scan of the material (i.e., Ga:Sb=8:92 film of 48 nm thickness) heated at a rate of 1° C./s, the appearance of the XRD peaks at 195° C. indicates crystallization of the material.

Figure 7:
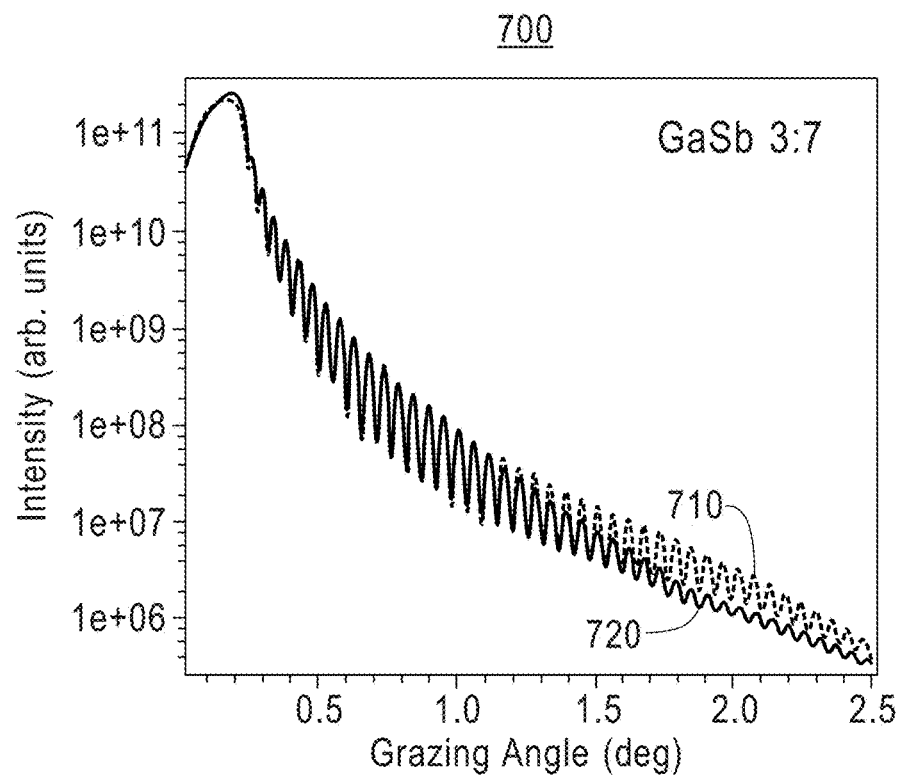
FIG. 7 shows a plot 700 of x-ray reflectivity (XRR) measurements performed on a Ga:Sb=3:7 film of 46 nm thickness as deposited (amorphous) and after heating to 350° C., in accordance with an embodiment of the present principles.

FIG. 7 shows a plot 700 of x-ray reflectivity (XRR) measurements performed on a Ga:Sb=3:7 film of 46 nm thickness as deposited (amorphous) (shown using line 710) and after heating to 350° C. (crystalline) (shown using line 720), in accordance with an embodiment of the present principles. In the plot 700, the x-axis represents grazing incidence angle in degrees and the y-axis represents intensity of reflected x-rays in relative units. At an optimum film composition of Ga:Sb=3:7, the change in film thickness and thus mass density is negligible as the XRR measurements show. The XRR spectrum of the film as deposited (amorphous) and after heating to 350° C. (crystalline) are practically identical.

Figure 8:
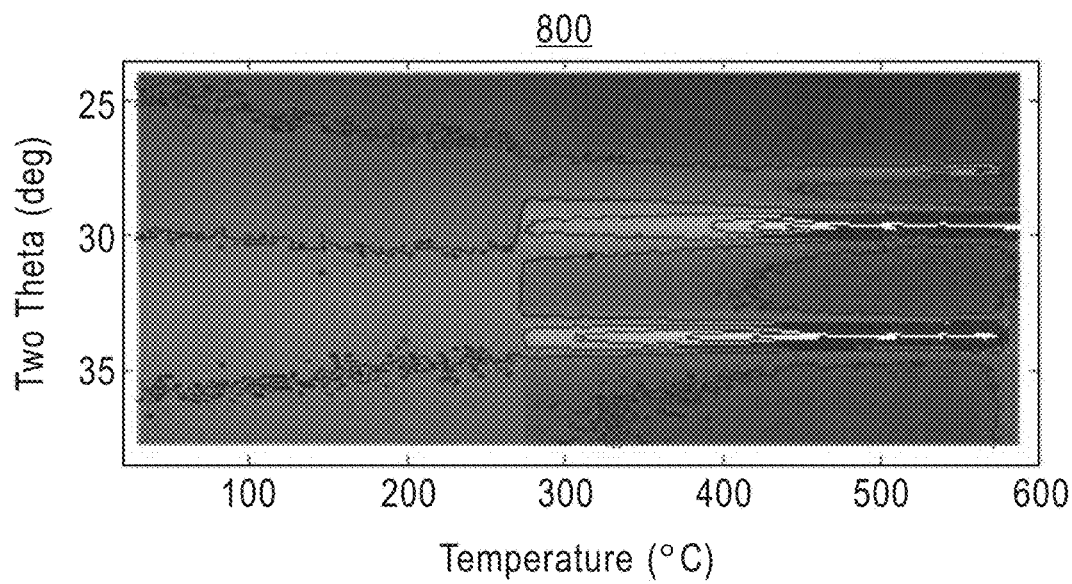
FIG. 8 shows a plot 800 of intensity of diffracted x-rays as a function of temperature during heating at 1 degree Celsius per second on the Ga:Sb=3:7 film of 46 nm thickness shown in FIG. 7, in accordance with an embodiment of the present principles.
Figure 9:
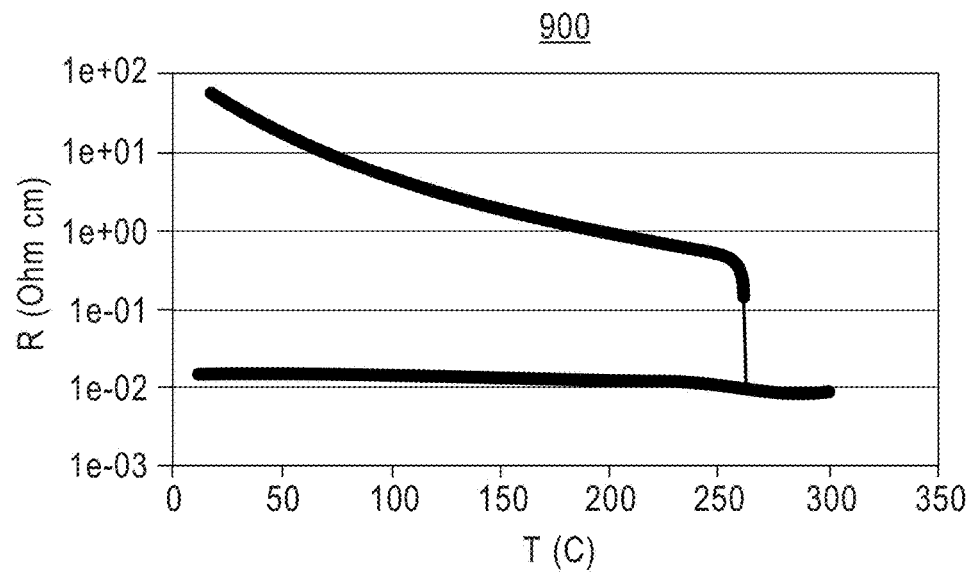
FIG. 9 shows a plot 900 of resistivity (R) versus temperature (T) for the Ga:Sb=3:7 film of 46 nm thickness shown in FIG. 7, in accordance with an embodiment of the present principles.
Figure 10:
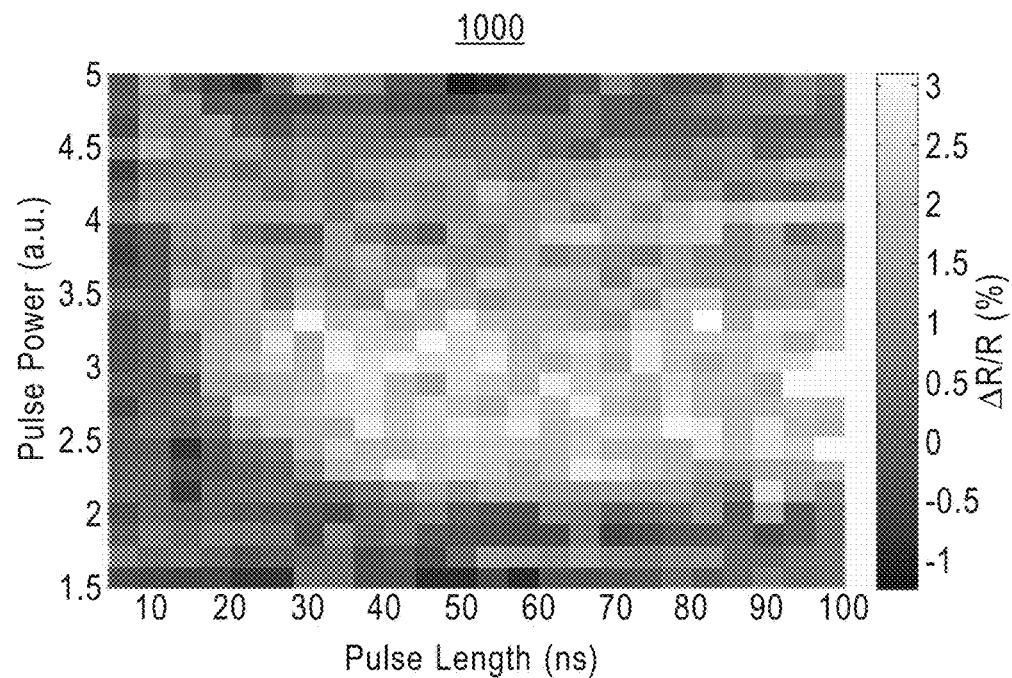
FIG. 10 shows a plot 1000 of reflectivity change ($\Delta R/R$) of a Ga:Sb=3:7 film of 46 nm thickness, in accordance with an embodiment of the present principles.

FIG. 8 shows a plot 800 of intensity of diffracted x-rays as a function of temperature during heating at 1 degree Celsius per second on the Ga:Sb=3:7 film of 46 nm thickness shown in FIG. 7, in accordance with an embodiment of the present principles. In the plot 600, the x-axis represents temperature (in degrees Celsius) and the y-axis represents two-theta angle (in degrees). The time-resolved XRD confirms again that the film heated to 350° C. is crystalline. The time resolved XRD shows that the crystallization temperature of this film is 274° C. That is, for the XRD scan of the material (i.e., Ga:Sb=3:7 film of 46 nm thickness) heated at a rate of 1° C./s, the appearance of the XRD peaks at 274° C. indicates crystallization of the material. Such a relatively high crystallization temperature is an indication for good data retention of such a material. In addition, resistivity versus temperature measurements show a large electrical contrast. FIG. 9 shows a plot 900 of resistivity (R) versus temperature (T) for the Ga:Sb=3:7 film of 46 nm thickness shown in FIG. 7, in accordance with an embodiment of the present principles. The originally amorphous, high resistance film was heated at a rate of 5° C./min to 300° C. and subsequently cooled down to room temperature. The sharp drop in resistance at 265° C. indicates crystallization, and upon cooling the film remains in the low resistance crystalline phase. The crystallization temperature measured by XRD and by resistivity versus temperature measurement is slightly different because of different heating rates. The difference in resistance between the amorphous, high resistance phase and the crystalline, low resistance phase is more than a factor of 1000 at room temperature FIG. 10 shows a plot 1000 of reflectivity change (ΔR/R) of a Ga:Sb=3:7 film of 46 nm thickness, in accordance with an embodiment of the present principles. In the plot 1000, the x-axis represents laser pulse width (in nanoseconds, ns) and the y-axis represents laser pulse power (in milliwatts, mW). The Ga:Sb=3:7 alloy shows a positive optical contrast typical for most phase change materials and different from the Ga:Sb=1:1 material, and an increase in reflectivity indicates recrystallization. Thus, optical laser tester results also indicate a fast recrystallization in about 30 ns.

Besides adding Antimony (Sb) to Ga:Sb=1:1 other elements such as Tellurium (Te), Silicon (Si), Germanium (Ge), Arsenic (As), Selenium (Se), Indium (In), Tin (Sn), Bismuth (Bi), Silver (Ag), Gold (Au) or combinations of these elements at the optimized level will also lead to a phase change material without mass density change which should not show voice formation after repeated cycling in a PCRAM device.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase change memory cell, comprising:
   a substrate; and
   a phase change material for performing a phase change function in the phase change memory cell, the phase change material having a mass density change of less than three percent during a transition between an amorphous phase and a crystalline phase, and being formed from a mixture consisting of Gallium and Antimony and at least one of Silicon, Germanium, Arsenic, Selenium, Bismuth, Silver, and Gold, the mixture comprising three atomic % parts Gallium to seven atomic % parts Antimony.

2. The phase change memory cell of claim 1, wherein the phase change material is formed from the mixture of Gallium and Antimony and at least two of Silicon, Germanium, Arsenic, Selenium, Bismuth, Silver, and Gold added to the mixture of Gallium and Antimony.

3. The phase change memory cell of claim 1, wherein the phase change material is formed from the mixture of Gallium and Antimony and at least three of Silicon, Germanium, Arsenic, Selenium, Bismuth, Silver, and Gold added to the mixture of Gallium and Antimony.

4. The phase change memory cell of claim 1, wherein the phase change material has an electrical contrast above an electrical contrast threshold and a switching time below a switching time threshold.

5. A method for forming a phase change memory cell, comprising:
   providing a substrate; and
   depositing a phase change material on the substrate the phase change material having a mass density change of less than three percent during a transition between an amorphous phase and a crystalline phase, and being formed from a mixture consisting of Gallium and Antimony and at least one of Silicon, Germanium, Arsenic, Selenium, Indium, Tin, Bismuth, Silver, and Gold, the mixture comprising three atomic % parts Gallium to seven atomic % parts Antimony.

6. The method of claim 5, wherein the phase change material is formed from the mixture of Gallium and Antimony and at least two of Silicon, Germanium, Arsenic, Selenium, Bismuth, Silver, and Gold added to the mixture of Gallium and Antimony.

7. The method of claim 5, wherein the phase change material is formed from the mixture of Gallium and Antimony and at least three of Silicon, Germanium, Arsenic, Selenium, Bismuth, Silver, and Gold added to the mixture of Gallium and Antimony.

8. The method of claim 5, wherein the phase change material has an electrical contrast above an electrical contrast threshold and a switching time below a switching time threshold.

9. A method for forming a phase change memory cell, comprising:
   providing a substrate; and
   depositing a mixture of Gallium, Antimony and at least one of, Silicon, Germanium, Arsenic, Selenium, Indium, Tin, Bismuth, Silver, and Gold on the substrate, the phase change material having a mass density change of less than 3 percent during a transition between an amorphous phase and a crystalline phase, and being foil led from a mixture consisting of Gallium and Antimony and at least one of Silicon, Germanium, Arsenic, Selenium, Indium, Tin, Bismuth, Silver, and Gold, the mixture comprising three atomic % parts Gallium to seven atomic % parts Antimony.

10. The method of claim 9, wherein said depositing step comprises:
    adding at least two of Silicon, Germanium, Arsenic, Selenium, Indium, Tin, Bismuth, Silver, and Gold to the mixture; and
    depositing the mixture on the substrate.

11. The method of claim 9, wherein the phase change material has an electrical contrast above an electrical contrast threshold and a switching time below a switching time threshold.

* * * * *